United States Patent
Nosrati

(10) Patent No.: US 11,574,838 B2
(45) Date of Patent: Feb. 7, 2023

(54) CERAMIC PEDESTAL HAVING ATOMIC PROTECTIVE LAYER

(71) Applicant: Watlow Electric Manufacturing Company, St. Louis, MO (US)

(72) Inventor: Mohammad Nosrati, Redwood City, CA (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 288 days.

(21) Appl. No.: 17/075,770

(22) Filed: Oct. 21, 2020

(65) Prior Publication Data

US 2021/0035849 A1 Feb. 4, 2021

Related U.S. Application Data

(62) Division of application No. 16/196,414, filed on Nov. 20, 2018, now Pat. No. 11,018,048.

(Continued)

(51) Int. Cl.
*H01L 21/00* (2006.01)
*H01L 21/687* (2006.01)
(Continued)

(52) U.S. Cl.
CPC .... *H01L 21/68757* (2013.01); *C23C 16/4586* (2013.01); *C23C 16/45536* (2013.01); *C23C 16/45544* (2013.01); *C23C 16/45553* (2013.01); *H01L 21/67103* (2013.01); *H01L 21/67109* (2013.01); *H01L 21/68792* (2013.01)

(58) Field of Classification Search
None
See application file for complete search history.

(56) References Cited

U.S. PATENT DOCUMENTS

| 4,539,061 A | 9/1985 | Sagiv |
| 7,871,676 B2 * | 1/2011 | Chiang ................ C23C 16/483 |
| | | 427/250 |

(Continued)

FOREIGN PATENT DOCUMENTS

| EP | 0844028 | 5/1998 |
| JP | H10298768 | 11/1998 |

(Continued)

OTHER PUBLICATIONS

Notice of Allowance issued to corresponding Korean Application 1020207017262, dated Aug. 9, 2021.

*Primary Examiner* — Steven M Marsh
(74) *Attorney, Agent, or Firm* — Burris Law, PLLC

(57) ABSTRACT

A method of manufacturing a support pedestal for use in semiconductor processing includes applying a protective layer on a conductive member of the support pedestal with an atomic layer deposition (ALD) process. The support pedestal has a support plate bonded to a tubular shaft. The support plate has a substrate, an electric element embedded in the substrate, and a conductive member connected to the electric element, and the tubular shaft defines an internal chamber. The ALD process introducing first precursors into the chamber of the tubular shaft to form a first monolayer on the conductive member, and introducing second precursors into the chamber of the tubular shaft to form a second monolayer on the first monolayer.

20 Claims, 6 Drawing Sheets

Related U.S. Application Data

(60) Provisional application No. 62/589,038, filed on Nov. 21, 2017.

(51) Int. Cl.
    *C23C 16/455*     (2006.01)
    *C23C 16/458*     (2006.01)
    *H01L 21/67*     (2006.01)

(56) References Cited

U.S. PATENT DOCUMENTS

| | | | | |
|---|---|---|---|---|
| 8,163,087 | B2* | 4/2012 | Faguet | C23C 16/5096 |
| | | | | 118/715 |
| 2004/0211764 | A1* | 10/2004 | Doering | C23C 16/45521 |
| | | | | 219/390 |
| 2008/0254231 | A1* | 10/2008 | Lin | C23C 16/45555 |
| | | | | 427/248.1 |
| 2009/0277895 | A1* | 11/2009 | Komatsu | C23C 16/4586 |
| | | | | 108/50.02 |
| 2010/0024732 | A1* | 2/2010 | Mokhlesi | C23C 16/45525 |
| | | | | 118/724 |
| 2011/0039026 | A1* | 2/2011 | Kato | C23C 16/45551 |
| | | | | 118/730 |
| 2015/0147890 | A1* | 5/2015 | Lin | C23C 16/45548 |
| | | | | 118/728 |

FOREIGN PATENT DOCUMENTS

| | | |
|---|---|---|
| JP | 2006186351 | 7/2006 |
| JP | 2007501902 A | 2/2007 |
| JP | 2016184642 | 10/2016 |
| JP | 2016213456 | 12/2016 |
| WO | 2001027346 | 4/2001 |
| WO | 2001040541 | 6/2001 |
| WO | 2002088421 | 11/2002 |
| WO | 2004063421 | 7/2004 |

* cited by examiner

CERAMIC PEDESTAL HAVING ATOMIC PROTECTIVE LAYER

CROSS-REFERENCE TO RELATED APPLICATIONS

This application is a divisional of U.S. application Ser. No. 16/196,414, filed on Nov. 20, 2018, titled CERAMIC PEDESTAL HAVING ATOMIC PROTECTIVE LAYER, which claims priority to and the benefit of U.S. Provisional Application No. 62/589,038, titled CERAMIC PEDESTAL HAVING ATOMIC PROTECTIVE LAYER filed Nov. 21, 2017. The disclosures of the above applications are incorporated herein by reference.

FIELD

The present disclosure relates generally to semiconductor processing apparatuses, and more particularly to pedestals for supporting and heating a substrate, such as a wafer, thereon.

BACKGROUND

The statements in this section merely provide background information related to the present disclosure and may not constitute prior art.

A pedestal for semiconductor processing is disposed in a semiconductor processing chamber and typically includes a wafer support plate and a tubular shaft secured to a central region of the wafer support plate. The wafer support plate may include a resistive heating element for generating heat. In addition, the wafer support plate may further include temperature sensors, or RF antennas, and ESC electrodes integrated in a substrate of the wafer support plate. The heater circuits, sensor devices, RF (antenna) and ESC electrode are terminated in the tubular shaft and routed to an external control system outside of the chamber.

The exterior of the pedestal is generally vacuum sealed in the semiconductor processing chamber. However, the chamber of the tubular shaft is in fluid communication with outside environment and thus is exposed to atmospheric pressure and air. The contact pins and the heater termination areas, while electrically insulated, are exposed to air from outside environment. The pedestal made of ceramic materials is typically operated at a temperature above 400° C. The high partial pressure of oxygen inside the tubular shaft at such elevated temperature may induce metal oxidation, corrosion, and higher electrical resistance locally on the contact pins and in the heater termination areas. Therefore, performance of the pedestal may be adversely affected or the lifetime of the pedestal may be shortened.

SUMMARY

In one form of the present disclosure, a method of manufacturing a support pedestal for use in semiconductor processing is provided. The support pedestal includes a support plate bonded to a tubular shaft, the support plate includes a substrate, an electric element embedded in the substrate, and a conductive member connected to the electric element, and the tubular shaft defines an internal chamber. The method includes applying a protective layer on the conductive member by an atomic layer deposition (ALD) process. In some variations, the ALD process includes introducing first precursors into the chamber of the tubular shaft to form a first monolayer on the conductive member, and introducing second precursors into the chamber of the tubular shaft to form a second monolayer on the first monolayer. In at least one variation, the ALD process further includes introducing a purge gas into the chamber of the tubular shaft before the second precursors are introduced into the chamber.

In some variations, the method includes heating the chamber of the tubular shaft during the ALD process. In such variations the method can include connecting a plasma chamber to the tubular shaft for heating the chamber of the tubular shaft and/or enclosing the support pedestal with a heated chamber for heating the chamber of the tubular shaft.

In at least one variation, the electric element is a resistive heating element, a temperature sensor, an RF antenna, or an electrode for an electrostatic chuck. In some variations, the electric element is the resistive heating element. And in such variations the method can include activating the resistive heating element for heating the chamber of the tubular shaft.

In some variations, the protective layer is an $Al_2O_3$ layer. And in at least one variation, the protective layer is in a compressive state.

In some variations, the conductive member is contact pins or heater termination areas.

In at least one variation, the protective layer is applied on the conductive member in situ.

In another form of the present disclosure, a method of manufacturing a support pedestal for use in semiconductor processing includes applying a protective layer on a conductive member of the support pedestal with an ALD process. The support pedestal includes a support plate bonded to a tubular shaft. The support plate includes a substrate, an electric element embedded in the substrate, and the conductive member connected to the electric element, and the tubular shaft defines an internal chamber. The ALD process includes introducing first precursors into the chamber of the tubular shaft to form a first monolayer on the conductive member, introducing a purge gas into the chamber of the tubular shaft, and introducing second precursors into the chamber of the tubular shaft to form a second monolayer on the first monolayer.

In some variations, the method further includes heating the chamber of the tubular shaft during the ALD process. In such variations, the method can include connecting a plasma chamber to the tubular shaft for heating the chamber of the tubular shaft. In the alternative, or in addition to, the method includes enclosing the support pedestal with a heated chamber for heating the chamber of the tubular shaft. In at least one variation, the method includes activating the electric element for heating the chamber of the tubular shaft and the electric element is a resistive heating element.

In some variations, the protective layer is an $Al_2O_3$ layer. IN the alternative, or in addition to, the protective layer is in a compressive state.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

Corresponding reference numerals indicate corresponding parts throughout the several views of the drawings.

DETAILED DESCRIPTION

The following description is merely exemplary in nature and is not intended to limit the present disclosure, application, or uses.

Figure 1:
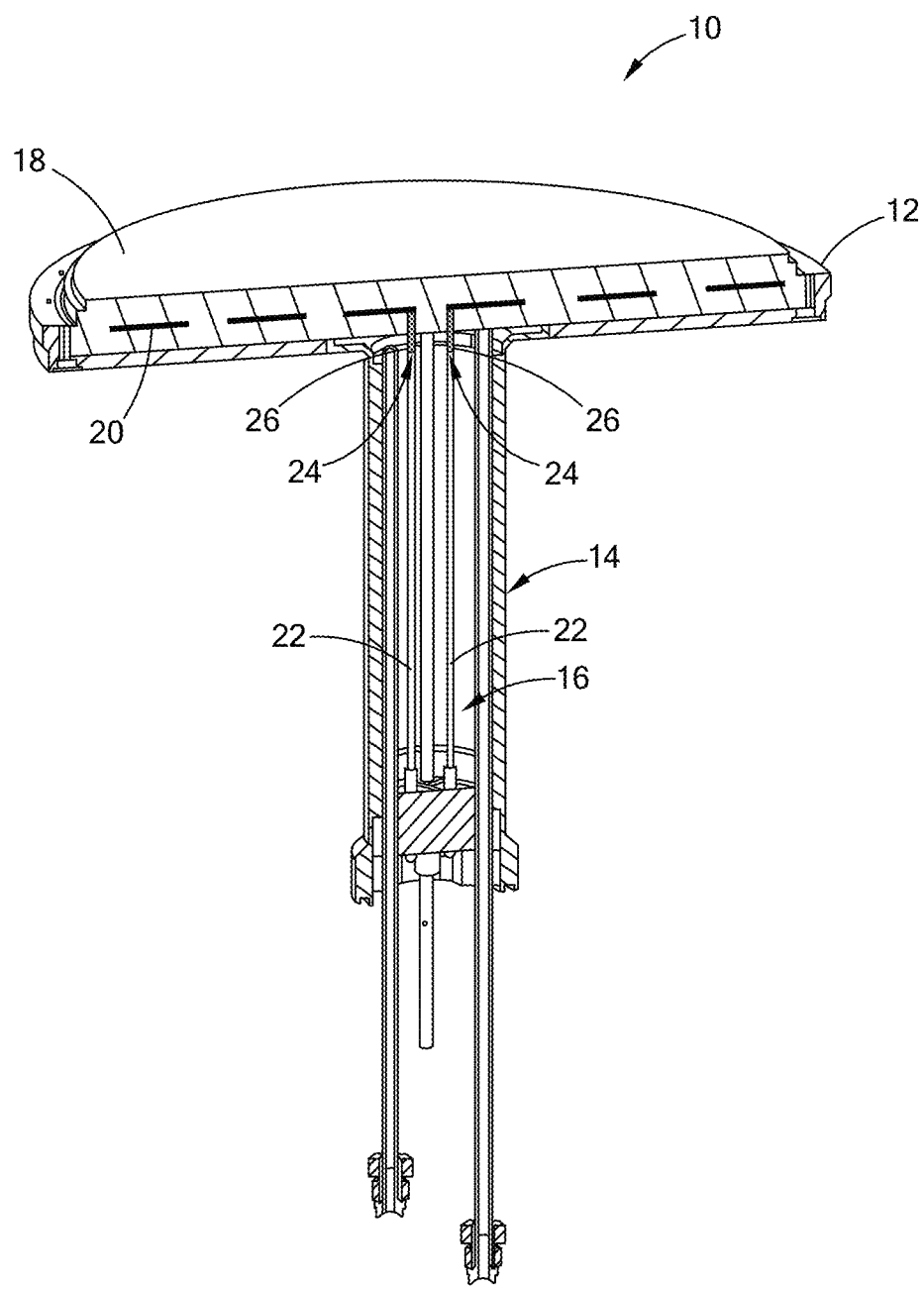
FIG. 1 is a perspective, cross-sectional view of a pedestal constructed in accordance with the teachings of the present disclosure.
Figure 2A:
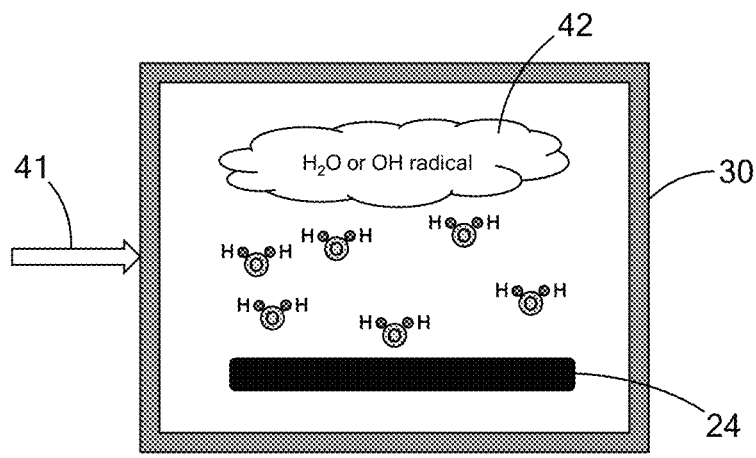
FIGS. 2A through 2F illustrate various steps of a process of applying a protective layer on a conductive member of the pedestal by an ALD process.
Figure 2B:
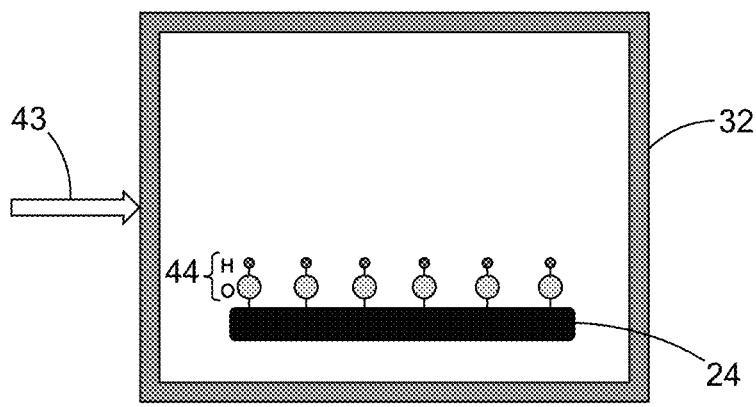
Figure 2C:
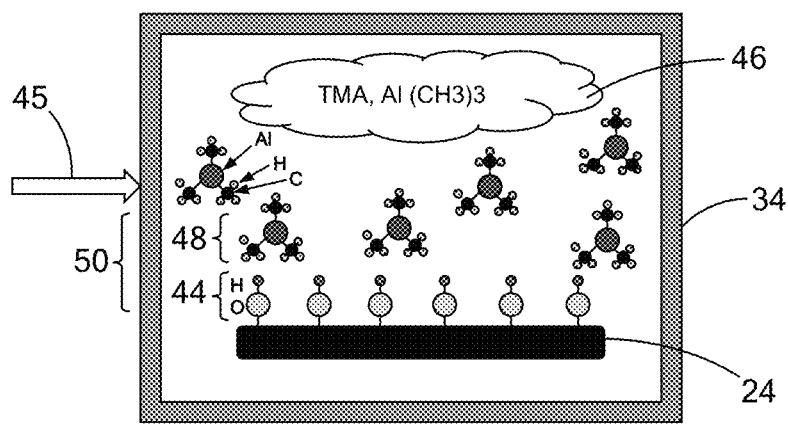
Figure 2D:
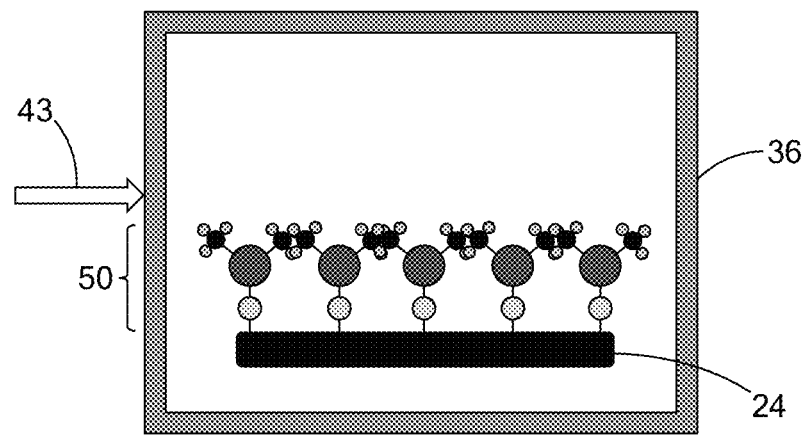
Figure 2E:
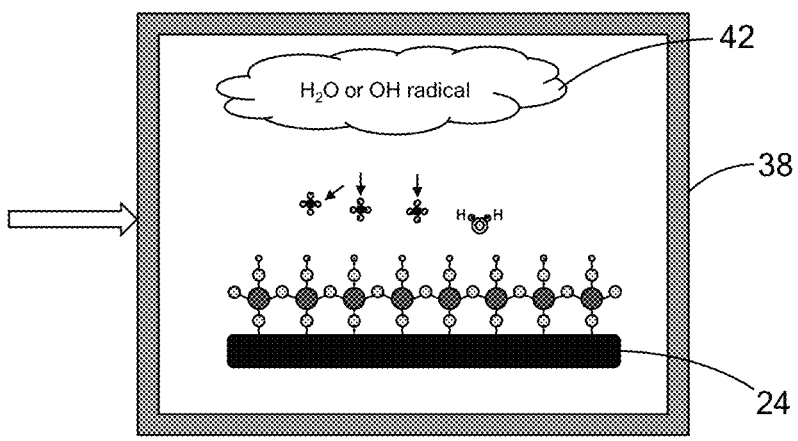
Figure 2F:
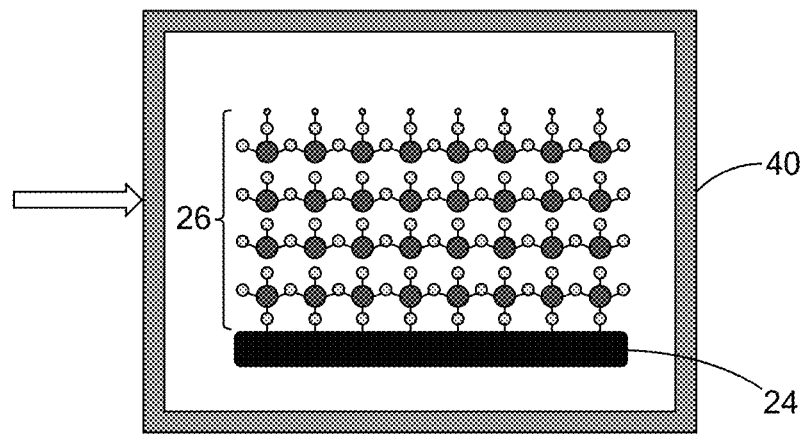

Referring to FIG. 1, a pedestal 10 constructed in accordance with the teachings of the present disclosure is used in a semiconductor processing chamber for supporting and heating a heating target, such as a wafer, thereon. The pedestal 10 includes a support plate 12 and a tubular shaft 14 that defines a hollow space or a chamber 16 and is attached to the support plate 12 for positioning and mounting the pedestal 10 in a semiconductor processing chamber (not shown). The support plate 12 includes a substrate 18 and at least one electronic or electric element 20 embedded in the substrate 18. The electric element 20 may be a resistive heating element, a temperature sensor, an electrode for an electrostatic chuck (ESC), or a Radio Frequency (RF) antenna, among others, depending on applications of the pedestal 10, or other device to which the teachings of the present disclosure may be applied.

The pedestal 10 further includes a plurality of electric cables 22 received in the tubular shaft 14 for connecting the at least one electric element 20 to an external power source (not shown). The at least one electric element 20 may be routed to a central region of the support plate 12 and is terminated with a plurality of conductive members 24, which, in turn, are connected to the electric cables 22. The conductive members 24 are disposed adjacent to the central region of the support plate 12 and are exposed in the chamber 16 of the tubular shaft 14 to facilitate connection of the electric element 20 to the electric cables 22. The conductive members 24 may be in the form of termination areas of a resistive heating element or contact pins connected to a temperature sensor, an electrostatic chuck electrode, or an RF antenna, among others. Therefore, if the conductive members 24 are, for example, the termination areas of the electric element 20, a portion (e.g., the termination areas) of the electric element 20 may be exposed in the chamber 16 of the tubular shaft 14.

A method of manufacturing a pedestal according to the present disclosure starts with preparing the pedestal 10 described in connection with FIG. 1. The pedestal 10 includes the support plate 12 and the tubular shaft 14, which are manufactured separately and then secured together by any of a variety of means, which in one form may be bonding. The support plate 12 in one form is a ceramic material. The pedestal 10, particularly the support plate 12, is manufactured in an oxygen free or vacuum environment to inhibit oxidation of the electric element 20 during manufacturing. The pedestal 10 may be a newly manufactured pedestal or a refurbished pedestal. Next, the pedestal 10 is mounted inside a semiconductor processing chamber. Thereafter, a protective layer 26 is applied to the conductive member 24 in situ by an Atomic layer deposition (ALD) process at post ceramic pedestal manufacturing to improve lifetime and performance of the pedestal 10. In one form, the protective layer 26 composition is optimized to be in a compressive stress state to improve performance of the layer during operation. Further, the ALD protective layer 26 may also be applied to the electric element 20 directly.

The ALD process is a thin film deposition process in which a film is grown on a surface of a substrate by exposing the surface of the substrate to alternate gaseous species (called precursors). The precursor molecules react with the material of the substrate one at a time in a sequential, self-limiting, manner. The ALD process is a conformal deposition process, which allows a material to grow uniformly with high precision on arbitrarily complex and large substrates.

Referring to FIGS. 2A through 2F, the process of applying a protective layer 26 on the conductive member 24 in situ may include a step of introducing a first gas 41, such as water vapor, into the chamber 16 of the tubular shaft 14 to generate $H_2O$ or OH radicals as first precursors 42 in step 30. Next, the first precursors 42 react with a surface of the conductive member 24 to form a first monolayer 44 in a self-limiting manner in step 32. The first monolayer 44 may be a hydroxyl layer. After the first monolayer 44 is formed, a purge gas 43, such as N2, is introduced into the chamber 16 of the tubular shaft 14 to purge excess water molecules that are not reacted with the material of the conductive member 24.

Next, a second gas 45, such as Trimethylaluminium TMA $(Al(CH_3)_3)$, is introduced into the chamber 16 of the tubular shaft 14 to generate TMA and $(Al(CH_3)_3)$ as second precursors 46 in step 34. The second precursors 46 react with the hydroxyl layer 44 to form a AlO—$(CH_3)_2$ layer 48 on top of the hydroxyl layer 44 and generate CH4 as byproducts in step 36. The hydroxyl layer 44 and the AlO—$(CH_3)_2$ layer 48 jointly form an $Al_2O_3$ layer 50. After the $Al_2O_3$ layer 50 is formed, purge gas 43, such as N2, is introduced into the chamber 16 of the tubular shaft 14 to purge excess second precursors 46 and the byproducts CH4 from the chamber 16 in step 36. Next, step 30 through step 36 are repeated in step 38. For example, water vapor is again introduced into the chamber 16 of the tubular shaft 14 to form another hydroxyl monolayer 44 on top of $Al_2O_3$ layer 50 and then TMA $(Al(CH_3)_3)$ is again introduced into the chamber 16 of the tubular shaft 14 to form another AlO—$(CH_3)_2$ layer 48. The hydroxyl monolayer 44 and the AlO—$(CH_3)_2$ monolayer 48 jointly form another $Al_2O_3$ layer 50. Forming a hydroxyl monolayer 44 and forming an AlO—$(CH_3)_2$ layer 48 to jointly form the $Al_2O_3$ layer 50 constitute a cycle. The thickness of the protective layer 26/50 is determined based on the number of cycles being performed in the chamber 16 of the tubular shaft 14. Finally, step 30 through step 36 are repeated until a predetermined thickness is achieved in step 40. In the illustrative example of FIG. 2F, the protective layer 26 includes four $Al_2O_3$ layers on the conductive member 24.

By the ALD process, a conformal and selective protective layer 26 at the atomic level is deposited inside of the tubular shaft 14, particularly on the conductive members 24 that are exposed in the chamber 16 and that connect the electric elements 20 to the electric cables 22. Advantageously, the film deposition and conformity is not dependent on geometry or feature size. The ALD process parameters such as partial pressure of reactive materials and precursors, exposure time, and temperature can be adjusted to deposit high quality film on the selective areas.

Figure 3:
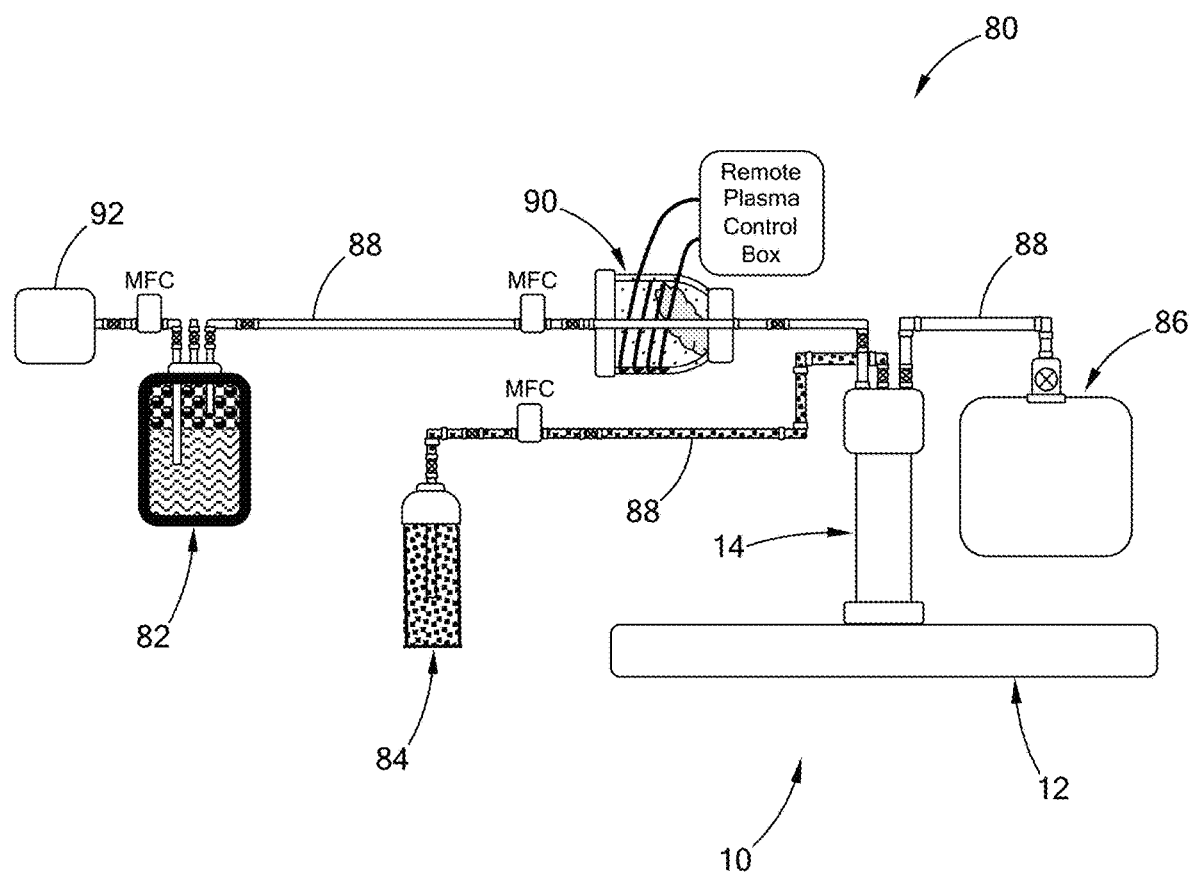
FIG. 3 is a schematic view of an ALD system for applying a protective layer inside a tubular shaft of a pedestal.

Referring to FIG. 3, an ALD system 80 for applying a protective layer 26 on the conductive member 24 is illustrated. The ALD system 80 includes a first precursor source 82, a second precursor source 84, and a pump 86 connected to the tubular shaft 14 of the pedestal 10 by a plurality of pipes 88. The first precursor source 82 contains water. Water vapor is generated when heat is applied to the first precursor source 82. A heater jacket may be provided to surround a container of the first precursor source 82 to heat the water contained therein. An inert gas source 92 may supply an inert gas, such as Ar, to the first precursor source 82 for carrying the reactive gas into the chamber. The second precursor source 84 may contain TMA (Trimethyl Aluminum).

In the present form, the ALD system 80 further includes a remote plasma chamber 90, which lowers the deposition process temperature to below 60° C. No external or internal heating is needed for performing the ALD process inside the tubular shaft 14 of the pedestal 10. Process parameters such as partial pressure, pulsing time, and plasma parameters of reactant gases and precursors can be optimized to deposit high quality protective film with residual compressive stresses. The compressive stresses generally improve performance and integrity of the protective film during thermal cycling and environments exposure.

Figure 4:
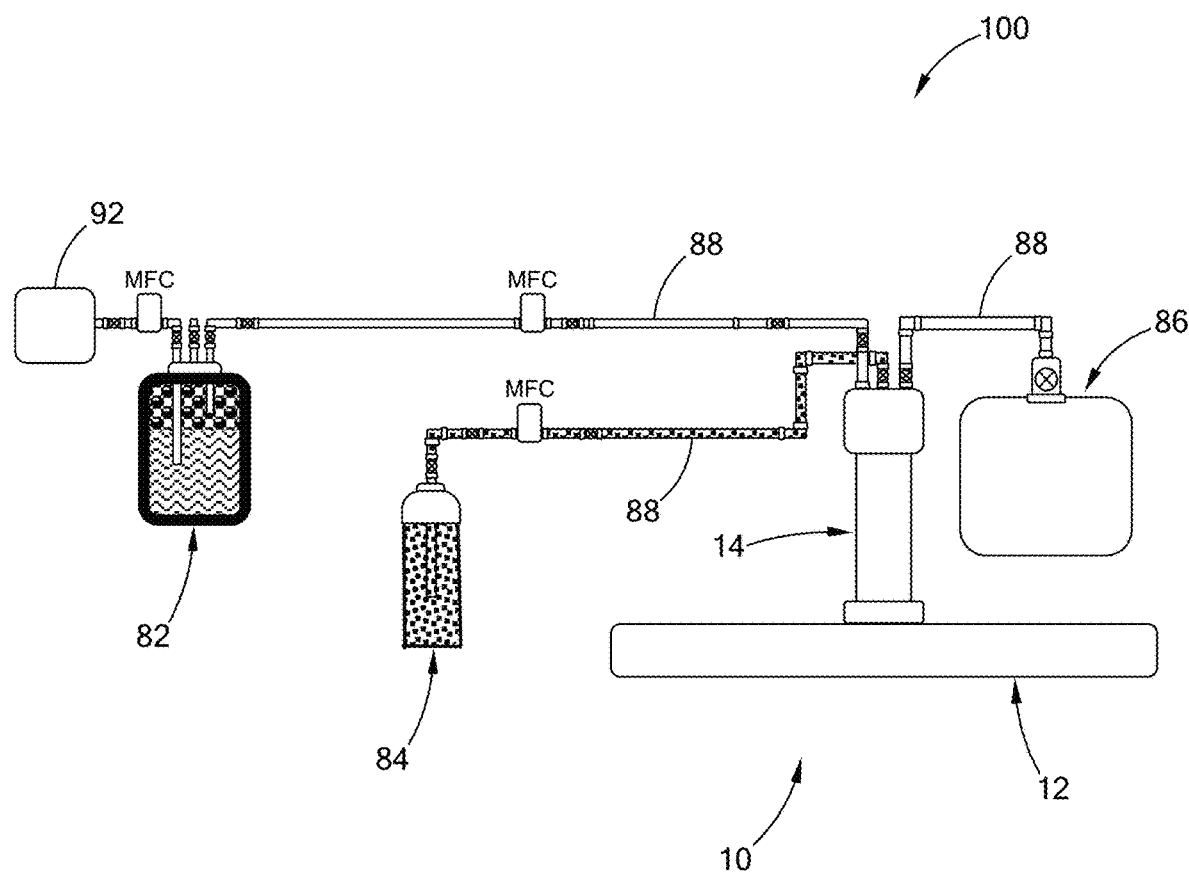
FIG. 4 is a schematic view of a variant of an ALD system for applying a protective layer inside a tubular shaft of a pedestal.

Referring to FIG. 4, a variant of an ALD system 100 for in situ deposition process inside the pedestal 10 is illustrated. The ALD system 100 is similar to the ALD system 80 of FIG. 3 except that the ALD system 100 does not include a remote plasma chamber 90. Instead, a self heating environment inside of the pedestal 10 is utilized by energizing the internal resistive heating element 20 (FIG. 1) in the pedestal 10. Process temperature is thus controlled by the internal resistive heating element 20. Similarly, process parameters such as temperature, partial pressure and pulsing time of reactant gases and precursors can be optimized to deposit high quality protective film with residual compressive stresses.

Figure 5:
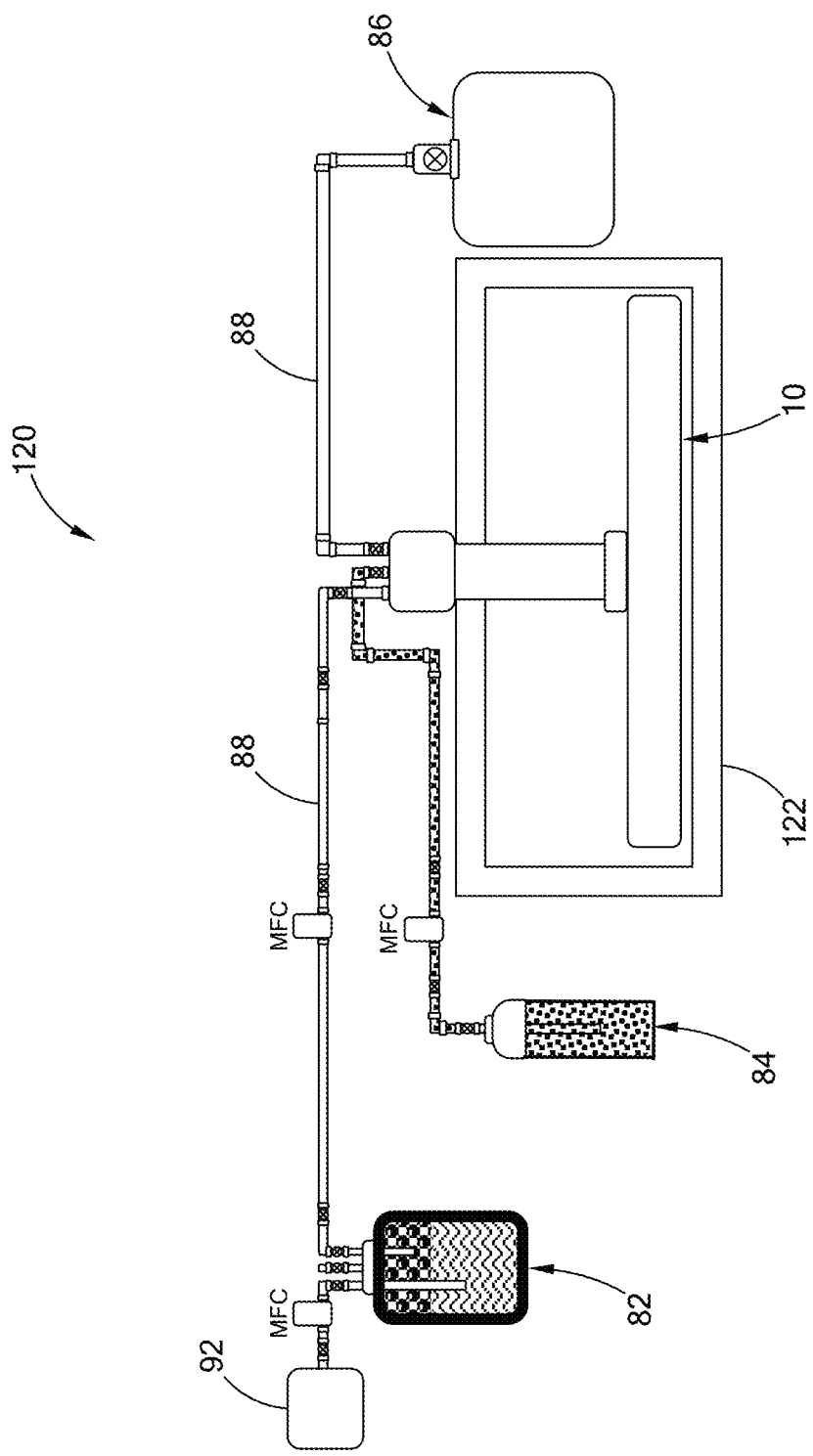
FIG. 5 is a schematic view of another variant of an ALD system for applying a protective layer inside a tubular shaft of a pedestal.

Referring to FIG. 5, another variant of an ALD system 120 for in situ deposition process inside the ceramic pedestal 10 is illustrated. The ALD system 120 is similar to the ALD system 100 of FIG. 4 except that the ALD system 120 includes an external heating chamber 122 for heating the pedestal 10 for the ALD process. Temperature of the process is thus controlled by the external heating chamber 122. Similarly, process parameters such as temperature, partial pressure and pulsing time of reactant gases and precursors can be optimized to deposit high quality protective film with residual compressive stresses.

Therefore, a variety of heating means such as, by way of example, the external heating chamber 122, the internal resistive heating element 20 (FIG. 1) in the pedestal 10, or the plasma chamber 90 can be employed to heat the pedestal 10 for the ALD process.

Like elements in FIGS. 4 and 5 relative to FIG. 3 are indicated by like reference numbers and thus the detailed description of the like elements is omitted herein for purposes of clarity.

By applying a protective layer 26 on the conductive member 24 that connects the electric element 20 to electric cables 22 in the chamber 16 of the tubular shaft 14, oxidation of the conductive member 24 can be inhibited, thereby reducing the risk of dielectric breakdown and arcing issue. This is particularly beneficial when multiple contact pins are disposed at close proximity to each other. With the protective layer 26, the number of the contact pins that are disposed inside the tubular shaft 14 can be increased to allow for more heating zones of a heater. Because the protective layer 26 is applied in situ, the protective layer 26 can be applied to new and refurbished pedestals. The film deposition is not limited to the size and shape of the surface of an object to be deposited. Therefore, the ALD process can be configured to deposit a high quality protective layer 26 on the contact pins or heater termination areas to improve performance and increase lifetime of the pedestal 10.

Moreover, the present disclosure reduces the need for a cover gas purge in the chamber 16 of the tubular shaft 14 to inhibit oxidation, which would otherwise be required for typical pedestals, thereby simplifying the manufacturing process and reducing manufacturing costs.

Further, due to the deposition of the protective layer 26, the support plate 12 does not need to be vacuum-sealed to the tubular shaft 14 during the securing/bonding process. Any metal or conductive members that may be exposed to air/oxygen during the manufacturing process can be protected against oxidation by performing the ALD process in situ to form a protective layer 26 on the metal or the conductive members. As such, in one example, the protective layer 26 is applied on the conductive members 24 (e.g., termination areas 24) of the electric element 20 that is exposed in the chamber 16 in situ by the ALD process thereby protecting the termination area 24 against oxidation.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A method of manufacturing a support pedestal for use in semiconductor processing, the support pedestal comprising a support plate bonded to a tubular shaft, the support plate comprising a substrate, an electric element embedded in the substrate, and a conductive member connected to the electric element, and the tubular shaft defining an internal chamber, the method comprising:
    applying a protective layer on the conductive member by an atomic layer deposition (ALD) process.

2. The method according to claim 1, wherein the ALD process comprises:
    introducing first precursors into the chamber of the tubular shaft to form a first monolayer on the conductive member; and
    introducing second precursors into the chamber of the tubular shaft to form a second monolayer on the first monolayer.

3. The method according to claim 2, wherein the ALD process further comprises introducing a purge gas into the chamber of the tubular shaft before the second precursors are introduced into the chamber.

4. The method according to claim 1 further comprising heating the chamber of the tubular shaft during the ALD process.

5. The method according to claim 4 further comprising connecting a plasma chamber to the tubular shaft for heating the chamber of the tubular shaft.

6. The method according to claim 4 further comprising enclosing the support pedestal with a heated chamber for heating the chamber of the tubular shaft.

7. The method according to claim 1, wherein the electric element is selected from a group consisting of a resistive heating element, a temperature sensor, an RF antenna, and an electrode for an electrostatic chuck.

8. The method according to claim 7, wherein the electric element is the resistive heating element.

9. The method according to claim 8 further comprising activating the resistive heating element for heating the chamber of the tubular shaft.

10. The method according to claim 1, wherein the protective layer is an $Al_2O_3$ layer.

11. The method according to claim 1, wherein the protective layer is in a compressive state.

12. The method according to claim 1, wherein the conductive member is selected from a group consisting of contact pins and heater termination areas.

13. The method according to claim 1, wherein the protective layer is applied on the conductive member in situ.

14. A method of manufacturing a support pedestal for use in semiconductor processing, the support pedestal comprising a support plate bonded to a tubular shaft, the support plate comprising a substrate, an electric element embedded in the substrate, and a conductive member connected to the electric element, and the tubular shaft defining an internal chamber, the method comprising:

applying a protective layer on the conductive member by an atomic layer deposition (ALD) process, the ALD process comprising:

introducing first precursors into the chamber of the tubular shaft to form a first monolayer on the conductive member;

introducing a purge gas into the chamber of the tubular shaft; and introducing second precursors into the chamber of the tubular shaft to form a second monolayer on the first monolayer.

15. The method according to claim 14 further comprising heating the chamber of the tubular shaft during the ALD process.

16. The method according to claim 15 further comprising connecting a plasma chamber to the tubular shaft for heating the chamber of the tubular shaft.

17. The method according to claim 15 further comprising enclosing the support pedestal with a heated chamber for heating the chamber of the tubular shaft.

18. The method according to claim 15 further comprising activating the electric element for heating the chamber of the tubular shaft, wherein the electric element is a resistive heating element.

19. The method according to claim 14, wherein the protective layer is an $Al_2O_3$ layer.

20. The method according to claim 14, wherein the protective layer is in a compressive state.

* * * * *